(12) United States Patent
Johnson

(10) Patent No.: US 11,836,738 B1
(45) Date of Patent: Dec. 5, 2023

(54) VEHICULAR IDENTIFICATION SYSTEM

(71) Applicant: Ramon Answar Hameen Johnson, St. Louis Park, MN (US)

(72) Inventor: Ramon Answar Hameen Johnson, St. Louis Park, MN (US)

( * ) Notice: Subject to any disclaimer, the term of this patent is extended or adjusted under 35 U.S.C. 154(b) by 0 days.

(21) Appl. No.: 17/518,134

(22) Filed: Nov. 3, 2021

Related U.S. Application Data

(63) Continuation-in-part of application No. 16/883,896, filed on May 26, 2020, now abandoned.

(Continued)

(51) Int. Cl.
| | | |
|---|---|---|
| *B60Q 1/56* | (2006.01) |
| *G06Q 30/018* | (2023.01) |
| *G06F 3/14* | (2006.01) |
| *H05K 5/00* | (2006.01) |
| *H05K 5/03* | (2006.01) |
| *H05K 5/02* | (2006.01) |
| *G01S 19/14* | (2010.01) |

(52) U.S. Cl.
CPC .............. *G06Q 30/018* (2013.01); *B60Q 1/56* (2013.01); *G01S 19/14* (2013.01); *G06F 3/14* (2013.01); *H05K 5/0017* (2013.01); *H05K 5/0204* (2013.01); *H05K 5/03* (2013.01)

(58) Field of Classification Search
CPC ........ G06Q 30/018; B60Q 1/56; G01S 19/14; G06F 3/14; H05K 5/0017; H05K 5/0204; H05K 5/03
See application file for complete search history.

(56) References Cited

U.S. PATENT DOCUMENTS

| | | | | |
|---|---|---|---|---|
| 5,105,179 A | * | 4/1992 | Smith | B60Q 1/56 |
| | | | | 340/815.45 |
| 7,210,830 B1 | * | 5/2007 | Mayo | B60Q 1/38 |
| | | | | 362/498 |

(Continued)

FOREIGN PATENT DOCUMENTS

| | | | | | |
|---|---|---|---|---|---|
| CN | 105391731 A | * | 3/2016 | ............. | G08G 1/127 |
| CN | 205375592 U | * | 7/2016 | | |

OTHER PUBLICATIONS

Wang et al. (CN 105391731A), Wireless electronic license plate, encryption method and encryption system of wireless electronic license plate, Mar. 9, 2016, 12 pages (Year: 2022).*

(Continued)

*Primary Examiner* — Tuyen K Vo
(74) *Attorney, Agent, or Firm* — JOHNSON AND PHUNG; Thomas N. Phung

(57) ABSTRACT

An electronic vehicular license plate system that includes a waterproof housing having a shape and size similar to a standard vehicle license plate with the housing mountable to a vehicle's existing license plate mounting region, the housing including a transparent display cover, an electronic visual display screen supported within the housing and viewable through the display cover of the housing with the screen displaying vehicle license plate information, a power source connected to and powering the screen, a central processing unit connected to the screen and controlling the operation of the screen, a wireless data transmission device connected to the central processing unit, a memory drive connected to the central processing unit, and a Global Positioning System connected to the central processing unit.

13 Claims, 4 Drawing Sheets

Related U.S. Application Data

(60) Provisional application No. 62/955,609, filed on Dec. 31, 2019.

(56) References Cited

U.S. PATENT DOCUMENTS

| | | | | |
|---|---|---|---|---|
| 2006/0213100 A1* | 9/2006 | McCann | ............... | G09F 21/04 40/591 |
| 2011/0252675 A1* | 10/2011 | Thomas | ............... | B60Q 1/503 40/205 |
| 2014/0072177 A1* | 3/2014 | Chou | ............... | G08G 1/0175 382/105 |
| 2017/0349098 A1* | 12/2017 | Uhm | ............... | G08G 1/0967 |
| 2021/0255465 A1* | 8/2021 | Lee | ............... | G02F 1/13439 |

OTHER PUBLICATIONS

Chen (CN 205375592U), No card charging system based on wireless electronic license plate, Jul. 6, 2016, 5pages (Year: 2022).*
KR 19990016157A, Car electronic license plates, Mar. 5, 1999, 4 pages (Year: 2022).*

* cited by examiner

US 11,836,738 B1

VEHICULAR IDENTIFICATION SYSTEM

CROSS REFERENCE TO RELATED APPLICATIONS

This application is a continuation-in-part application of my co-pending patent application Ser. No. 16/883,896; filed on May 26, 2020; titled INSTA TAB, which priority to now expired provisional patent application Ser. No. 62/955,609; filed on Dec. 31, 2019; titled INSTA TAB.

FIELD OF THE INVENTION

This invention relates generally to vehicular information identification and, more specifically to a system and device for providing visual notice relating to various vehicular registration information and a system of wirelessly updating a vehicle's registrations and renewals.

STATEMENT REGARDING FEDERALLY SPONSORED RESEARCH OR DEVELOPMENT

None

REFERENCE TO A MICROFICHE APPENDIX

None

BACKGROUND OF THE INVENTION

Motorized vehicles such as cars, motorcycles, trucks, and recreational vehicle are required to have a license plate and be registered for use on public roads by the appropriate governmental agency such as the department of vehicles of the associated states.

Vehicle registration requirements vary from state to state, but are processed and controlled by a State's Department of Motor Vehicles. Vehicle owners are generally required to renew their vehicle's registration every year. Vehicular renewal typically involves obtaining a new vehicle registration sticker through the state's DMV, which is attached to the existing license plate for a vehicle. The stickers are usually issued in a different color for each year, and display the year that the registration extends to. Vehicle owners failing to renew registrations can be ticketed and fined by law enforcement.

Vehicle registrations and renewals are tedious and expensive for both the vehicle owner and the governmental agency since existing vehicle registration systems may be paper intense, requiring mailing of registration reminders, and printing stickers and mailing out the new stickers, which sometime can get lost in postal. The license plate stickers are also prone to be damage not only from environmental conditions but also from vandalism or theft. In addition, vehicle license plates must also be replaced after a certain age of the vehicle, which also results in additional costs related to their replacement.

Vehicle registrations, renewal and vehicle license plate replacement can also be done at the governmental agency's local office but due to current pandemic times, it can be unsafe to wait in line in a crowded room for hours on hours to renew the vehicle's registration as the in-person registrant may be exposing themselves to a greater chance of infection. In view of the above, there exist a need for an improved vehicle registration and renewal system.

SUMMARY OF THE INVENTION

Briefly, the present invention is directed to an electronic vehicular license plate system having a waterproof housing having a shape and size similar to a standard vehicle license plate. The housing is mountable to a vehicle's existing license plate mounting region and includes a transparent display cover and an active electronic visual display screen supported within the waterproof housing with the screen viewable through the transparent display cover of the waterproof housing. The screen functions to electronically display a current required government issued vehicular license plate information associated with a vehicle including a status of the vehicle registration information such as a status of the vehicular state registration information pertaining to the vehicle.

The electronic vehicular license plate system also includes a power source connected to and powering the electronic visual display screen, a central processing unit supported within the waterproof housing and connected to the electronic visual display screen with the central processing unit controlling the operation of the electronic visual display screen. The central processing unit is configured to wirelessly receive, store, and transmit updated registration information pertaining to the associated vehicle from a remote server to the electronic visual display screen.

The electronic vehicular license plate system further includes a wireless data transmission device supported within the waterproof housing and connected to the central processing unit, a memory drive supported within the waterproof housing and connected to the central processing unit for storing vehicular information including government issued vehicular license plate information associated with the vehicle, and a Global Positioning System supported within the waterproof housing and connected to the central processing unit. The information displayed by the electronic visual display screen may be changed through a communication between the personal electronic device, the remote server, and the central processing unit.

The electronic vehicular license plate system may also include a software application loaded onto the central processing unit and stored by the memory drive with the software application communicating with a remote server and a personal electronic device to transmit information relating to the registration status of the vehicle to the electronic visual display screen.

BRIEF DESCRIPTION OF THE DRAWINGS

FIG. 2 is a partial cross-sectional view of the electronic vehicular license plate system of

FIG. 1;

DESCRIPTION OF THE PREFERRED EMBODIMENT

Figure 1:
FIG. 1 is a perspective view showing an embodiment of an electronic vehicular license plate system of the present invention.

The general purpose of the present invention, which will be described subsequently in greater detail, is to provide a system and device for providing not only a wireless system for vehicle registrations, renewal and vehicle license plate replacement but also to provide visual notice relating to various vehicular registration and identification information including vehicular license plate renewal information, commercial vehicular identification and other items requiring a registration and/or renewals.

There has thus been outlined the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the disclosing subject matter be regarded as including such equivalent constructions insofar as they do not depart from the spirit and scope of the present invention.

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

In addition, the accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of any potential claims.

Figure 2:
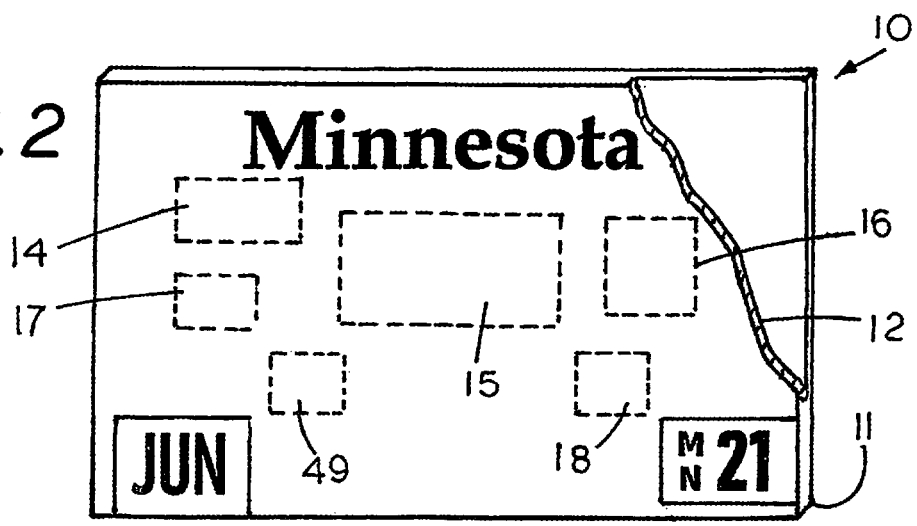

Referring to the drawings, FIG. 1 is a perspective view and FIG. 2 is a partial cross-sectional view showing an embodiment of an electronic vehicular license plate system 10 of the present invention. Electronic vehicular license plate system 10 generally includes a waterproof housing 11 having a shape and size similar to a standard vehicle license plate and is mountable to a vehicle's existing license plate mounting region normally located at the front and rear of a vehicle.

The waterproof housing 11 includes a weather resistant transparent display cover 12 and an active electronic visual display screen 13 supported within the waterproof housing 11 with the screen viewable through the transparent display cover of the waterproof housing. It is noted that the active electronic visual display screen 13 may be water-resistant to extend the use-life of the electronic vehicular license plate system 10.

The active electronic visual display screen 13 may be in the form of a LCD based screen, a LED based screen, or an OLED based screen and preferably functions to electronically display all current and required government issued vehicular license plate information associated with a vehicle including but not limited to the information contained on a typical vehicular license plate such as a status of the vehicular state registration information pertaining to the vehicle or license plate tab 20.

The electronic vehicular license plate system 10 also includes a power source 14 connected to and powering the electronic visual display screen 13 and a central processing unit 15 supported within the waterproof housing 11 and connected to the electronic visual display screen 13 with the central processing unit 15 controlling the operation of the electronic visual display screen 13. It is noted that the power source 14 may include but is not limited to a vehicle's battery, a back-up rechargeable battery supported within the waterproof housing 11 and their combination.

An option feature of the present invention may include the back-up rechargeable battery supported within the waterproof housing 11 being connected to the vehicle's battery so that the back-up rechargeable battery is either constantly charged or charged while the vehicle is in use.

In order to reduce or prevent theft of the present invention, an optional feature of the electronic vehicular license plate system 10 may include the electronic visual display screen turning off and locking access to the central processing unit if corrupted. Corruption of the electronic vehicular license plate system 10 may include but is not limited to the loss of power to the electronic vehicular license plate system 10. As such, the electronic vehicular license plate system 10 may provide either a visual indictor or warning or an electronic indictor or warning when the back-up rechargeable battery supported within the waterproof housing 11 runs low. Once corrupt the electronic vehicular license plate system 10 may be unlocked by a state certified service provider or by authorization by a governmental entity such as the State's Department of Motor Vehicle.

Also connected to the central processing unit 15 and supported within the waterproof housing 11 is a wireless data transmission device such as a cellular module 16 which functions to allow the electronic vehicular license plate system 10 to communicate and exchange information with a remote server, a memory drive 17 which functions to store vehicular information including government issued vehicular license plate information associated with the vehicle, and a Global Positioning System 18, which to functions to provide information relating to the geographical location of the electronic vehicular license plate system 10. The cellular module 16, memory drive 17, and Global Positioning System 18 work in unison to allow the central processing unit 15 to wirelessly receive, store, and transmit updated registration information pertaining to the associated vehicle from a remote server to the electronic visual display screen 13.

In regards to the wireless data transmission device, the wireless data transmission device may comprise a 3G/4G/4G LTE/5G cellular phone chip, a Wi-fi, NFC, Bluetooth chip or any combination thereof to allow for the transfer of instruction and information between the central processing unit and the remote server, a personal electronic device, or the combination with the personal electronic device is preferably comprising a personal computer, a smartphone or a tablet. For example, in the embodiment of FIG. 2 the electronic vehicular license plate system 10 is shown including both the cellular module 16 and a Bluetooth chip 49.

In order to process and facilitate the communication between the electronic vehicular license plate system 10, the remote server, and the personal electronic device, the present invention may also include a software application loadable either on to the personal electronic device, onto the central processing unit 15 or the combination. If loaded onto the central processing unit 15, the software application will preferably be stored by the memory drive 17 with the software application communicating with the remote server and the personal electronic device to transmit information relating to the registration status of the vehicle to the electronic visual display screen 13. The software application preferably also includes an electronic payment processing system incorporated therein which will allow the vehicle's owner to pay for the vehicle registrations, renewal and vehicle license plate replacement in addition to any other features that may be incorporated with electronic vehicular license plate system 10.

The above will enable the electronic vehicular license plate system 10 to provide not only a wireless system for vehicle registrations, renewal and vehicle license plate replacement but also to provide visual notice relating to various vehicular registration and identification information including vehicular license plate renewal information, commercial vehicular identification and other items requiring a registration and/or renewals.

Figure 3:
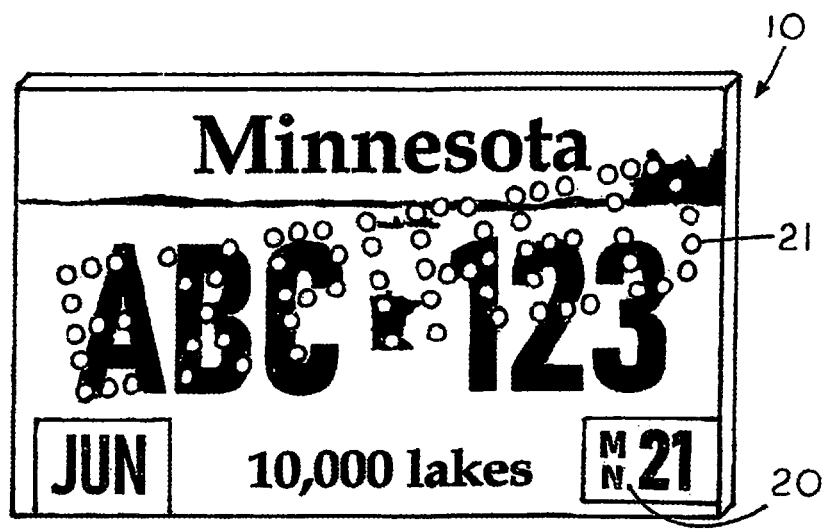
FIG. 3 is a perspective view showing the electronic vehicular license plate system displaying a registration status of the as being expired.

FIG. 3 is a perspective view showing the electronic vehicular license plate system 10 with the electronic visual display screen 13 updated to display a registration status 21 of the vehicle associated with the electronic vehicular license plate system 10 as being expired.

Figure 4:
FIG. 4 is a perspective view showing the electronic vehicular license plate system with a new vehicle license plate design.

FIG. 4 is a perspective view showing the electronic vehicular license plate system 10 with the electronic visual display screen 13 communicating with the personal electronic device, the remote server, and the central processing unit 15 to change the vehicle license plate design of FIG. 1 to a new vehicle license plate design for the vehicle 23.

Figure 5:
FIG. 5 is a perspective view showing the electronic vehicular license plate system displaying the vehicle as being stolen.

FIG. 5 is a perspective view showing the electronic vehicular license plate system 10 with the electronic visual display screen 13 updated to display a vehicular license plate information 25 indicating that the vehicle has been stolen. In order to improve visibility and capture great public attention, the electronic visual display screen 13 may also change a color of a background 24 of the electronic visual display screen 13.

Figure 6:
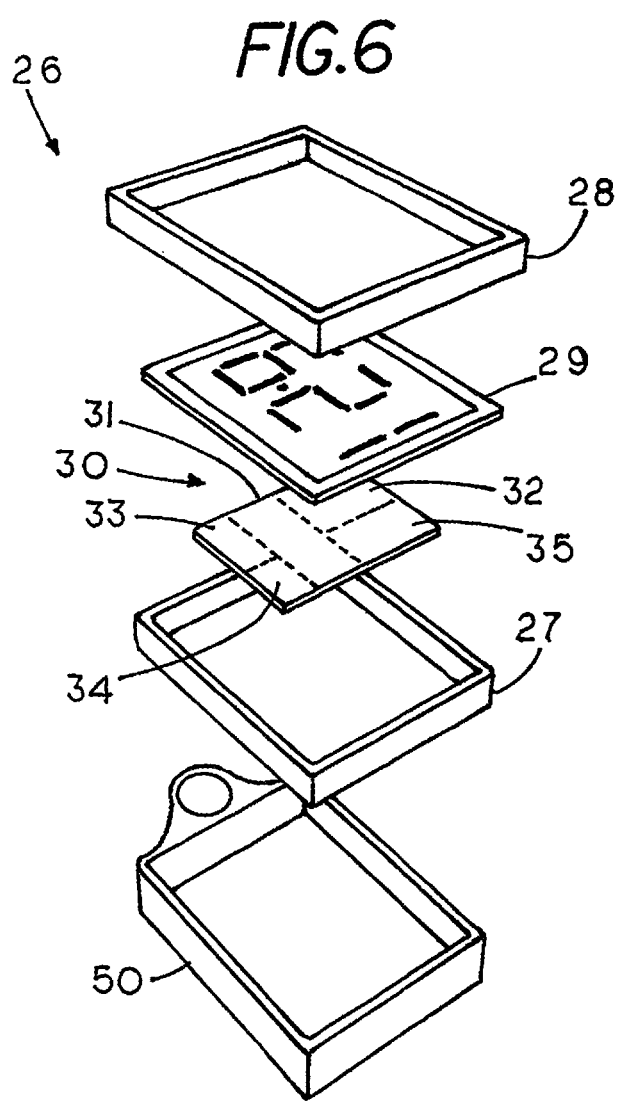
FIG. 6 is a perspective blow-up view showing an electronic vehicular license plate tab.

FIG. 6 is a perspective blow-up view showing an alternative embodiment of the present invention comprising an electronic vehicular license plate tab 26. Electronic vehicular license plate tab 26 generally includes a waterproof housing 27 having a shape and size similar to a standard vehicle license plate tab. The waterproof housing 27 is mountable to a vehicle's existing license plate tab mounting region and includes a transparent display cover 28, an active electronic visual display screen 29 supported within the waterproof housing 27 with the active electronic visual display screen 29 viewable through the transparent display cover 28 of the waterproof housing 27. The active electronic visual display screen 29 functions to electronically display a State electronically issued license plate tab for the associated vehicle.

The electronic vehicular license plate tab 26 also includes an electronic control board 30 supported within the waterproof housing 27 and connected to the electronic visual display screen 29, a combined central processing unit 31 connected to the electronic control board 30 for controlling the operation of the electronic visual display screen 29, a power source 32 connected to the electronic control board 30 and powering the electronic visual display screen 29 along with electronic control board 30, a wireless data transmission device 33 supported within the waterproof housing 27 and connected to the electronic control board 30, and a memory drive 34 supported within the waterproof housing and connected to the electronic control board 34 for storing vehicular information including current State issued registration status of the vehicle's license plate.

The electronic vehicular license plate tab 26 may also include a Global Positioning System 35 supported within the waterproof housing 27 and connected to the electronic control board 30. The license plate tab 26 may be electronically updated through a communication between a personal electronic device, a remote server, and the central processing unit electronic control board 30.

The electronic vehicular license plate tab 26 is also shown including an optional tab dock which functions to affix the electronic vehicular license plate tab 26 to a standard license plate.

Figure 7:
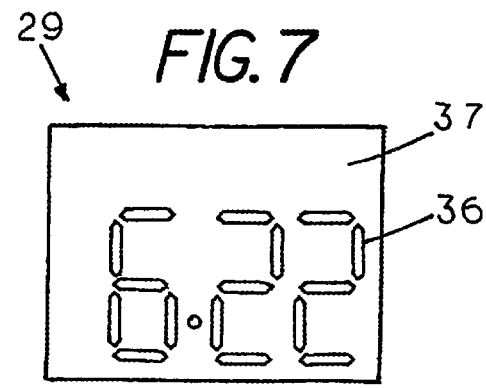
FIG. 7 is a front view showing an electronic visual display screen identifying a month and year of the current license plate tab information.

FIG. 7 is a front view showing the electronic visual display screen 29 of FIG. 6, which generally includes digital numbers 36 identifying the month and year of the current license plate tab information for the associated vehicle supported within a background 37 of the electronic visual display screen 29.

Figure 8:
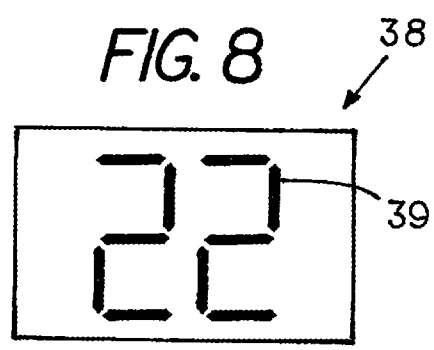
FIG. 8 is a front view showing an electronic visual display screen identifying a year of the current license plate tab information.

FIG. 8 is a front view showing an alternative embodiment of an electronic visual display screen 38 that includes digital numbers 39 identify the year of the current license plate tab information for the associated vehicle supported within a background 37 of the electronic visual display screen 29.

Figure 9:
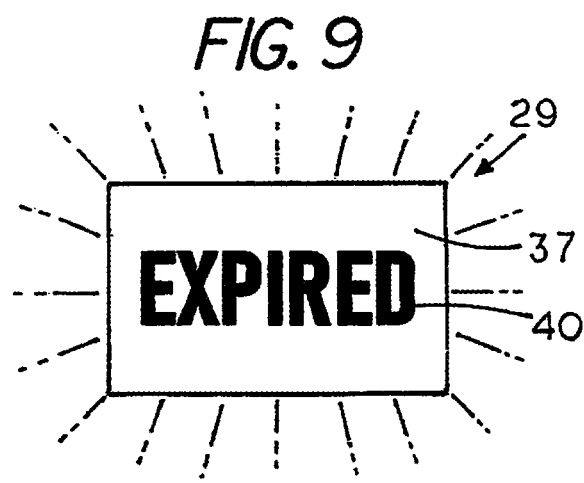
FIG. 9 is a front view showing the electronic visual display screen of FIG. 6 updated to the current license plate tab information of the vehicle as being expired.

FIG. 9 is a front view showing the electronic visual display screen 29 of FIG. 6 in which the electronic visual display screen 29 has been updated from the digital numbers 39 to the current license plate tab information of the vehicle as being expired. In order to highlight the current expiration status of the license plate tab information to legal authorities the background 37 of the electronic visual display screen 29 may change colors, providing a flashing action, or both.

Figure 10:
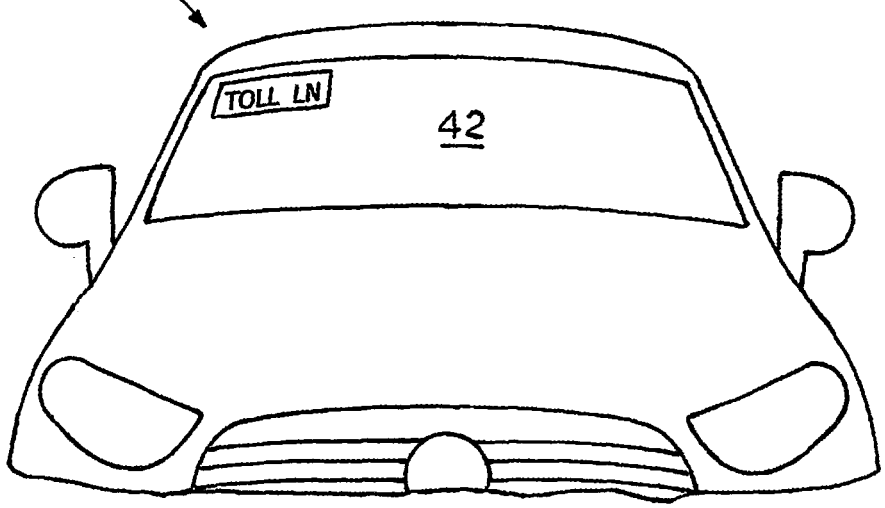
FIG. 10 is a front view of a vehicle showing an alternative embodiment of an electronic vehicular window display system attached to a vehicle's windshield.
Figure 11:
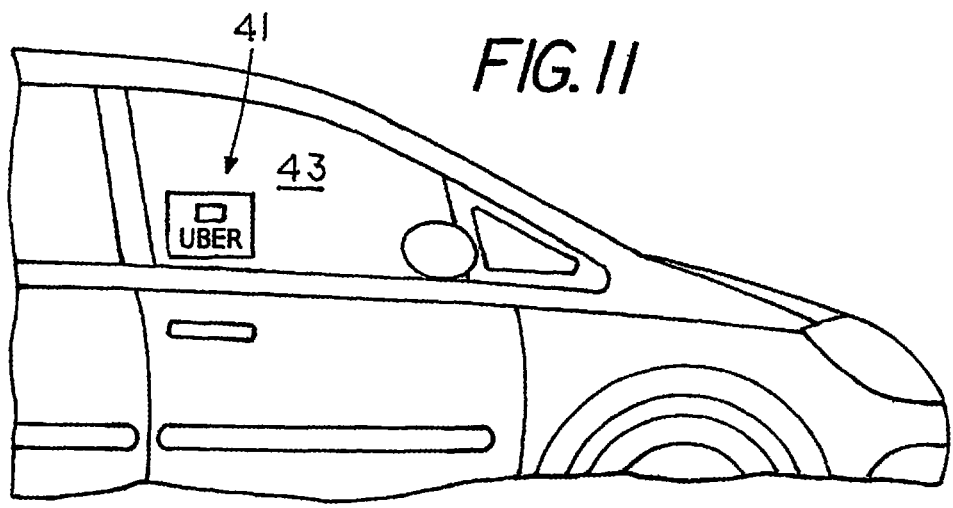
FIG. 11 is a side view showing the electronic vehicular window display system of FIG. attached to a vehicle's front passenger side window.

FIG. 10 is a front view of a vehicle showing an alternative embodiment of the present invention comprising an electronic vehicular window display system 41 attached to a vehicle's windshield 42. FIG. 11 is a side view showing the electronic vehicular window display system 41 attached to a vehicle's front passenger side window 43.

Figure 12:
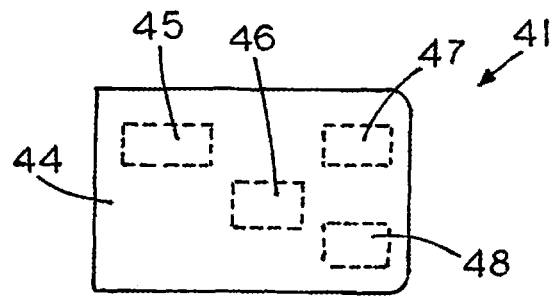
FIG. 12 is a front view of the electronic vehicular window display system of FIGS. 10 and 11.

FIG. 12 is a front view of the electronic vehicular window display system 41 of FIGS. 10 and 11. The electronic vehicular window display system 41 generally includes a flexible, thin, film-like, transparent active LCD display 44 mountable to an interior glass surface 42 and 43 of a vehicle's window. The transparent active LCD display 44 includes a power source 45 connected to and powering the transparent LCD display 44, a central processing unit 46 connected to the transparent LCD display 44, a wireless data transmission device 47 connected to the central processing unit 44, and a memory drive 48 connected to the central processing 46 unit for storing vehicular information including vehicle business licensure information, vehicle insurance information, state park-pass, or parking permit. The vehicle business licensure information may include information regarding a vehicle's ride-hailing, food delivery, package delivery, couriers, freight transportation services and the current status of the services.

Similar to the embodiment of FIGS. 14, the electronic vehicular window display system 41 may also include a software application having an electronic payment processing system incorporated therein which will allow the vehicle's owner to pay for various vehicle related fees including but not limited to vehicle business licensure information, toll lane fees, monthly toll lane membership dues, annual state park pass dues, or parking permit dues, and temporary parking dues.

A feature of the electronic vehicular window display system 41 is that the transparent active LCD display 44 is updatable through a communication between a personal electronic device, a remote server, and the central processing unit 46. In addition, the power source 45 may include but is not limited to a vehicle battery, a back-up battery either supported within or external of the transparent active LCD display 44.

I claim:

1. An electronic vehicular license plate system comprising:
   a waterproof housing having a shape and size similar to a standard vehicle license plate, said housing mountable to a vehicle's existing license plate mounting region, said housing including a transparent display cover;
   an active electronic visual display screen supported within said waterproof housing, said screen viewable through said transparent display cover of said waterproof housing, said screen electronically displaying a current required government issued vehicular license plate information associated with a vehicle including a status of the vehicle registration information;
   a power source connected to and powering said electronic visual display screen;
   a central processing unit supported within said waterproof housing and connected to said electronic visual display screen, said central processing unit controlling the operation of said electronic visual display screen, said central processing unit configured to wirelessly receive, store, and transmit updated registration information pertaining to said associated vehicle from a remote server to said electronic visual display screen;
   a wireless data transmission device supported within said waterproof housing and connected to said central processing unit;
   a memory drive supported within said waterproof housing and connected to said central processing unit for storing vehicular information including government issued vehicular license plate information associated with said vehicle;
   a software application loaded onto said central processing unit and stored by said memory drive, said software application communicating with ft the remote server and a personal electronic device to confirm a wireless renewal of the registration of said vehicle and to transmit information relating to the registration status of said vehicle to said electronic visual display screen; and
   a Global Positioning System supported within said waterproof housing and connected to said central processing unit.

2. The system of claim 1 wherein the electronic visual display screen is configured to visually indicate a status of said vehicular state registration information pertaining to said vehicle.

3. The system of claim 1 wherein said electronic visual display screen changes a color of a background of said electronic visual display screen depending on the status of said vehicular state registration information pertaining to said vehicle.

4. The system of claim 1 wherein said power source comprises a vehicle battery and a back-up rechargeable battery supported within said waterproof housing.

5. The system of claim 1 wherein a vehicle license plate design for said vehicle may be changed through a communication between said personal electronic device, said remote server, and said central processing unit.

6. The system of claim 1 wherein the personal electronic device comprises a personal computer, a smartphone or a tablet.

7. The system of claim 1 wherein the wireless data transmission device comprises a 3G/4G/4G LTE/5G cellular phone chip, a Wi-fi, NFC, Bluetooth chip, or the various combination to allow for the transfer of instruction and information between said central processing unit and said remote server, a personal electronic device, or the combination.

8. The system of claim 1 wherein the electronic visual display screen comprises an LCD based screen, a LED based screen, or an OLED based screen.

9. The system of claim 1 wherein the electronic visual display screen may be updated to display said vehicle license plate as being expired or that said vehicle has been stolen.

10. The system of claim 1 wherein the electronic visual display screen turns off and locks access to said central processing unit if corrupted.

11. An electronic vehicular license plate tab comprising:
    a waterproof housing having a shape and size similar to a standard vehicle license plate tab, said housing mountable to a vehicle's existing license plate tab mounting region, said housing including a transparent display cover;
    an active electronic visual display screen supported within said waterproof housing, said screen viewable through said transparent display cover of said waterproof housing, said screen electronically displaying a State electronically issued license plate tab for an associated vehicle;

a power source connected to and powering said electronic visual display screen;

a central processing unit supported within said waterproof housing and connected to said electronic visual display screen, said central processing unit controlling the operation of said electronic visual display screen, said central processing unit configured to wirelessly receive, store, and transmit updated registration information pertaining to said associated vehicle from a remote server to said electronic visual display screen;

a wireless data transmission device supported within said waterproof housing and connected to said central processing unit;

a memory drive supported within said waterproof housing and connected to said central processing unit for storing vehicular information including current State issued registration status of said vehicle's license plate; and a software application loaded onto said central processing unit and stored by said memory drive, said software application communicating with the remote server and a personal electronic device to confirm a wireless renewal of the registration of said vehicle and to transmit information relating to the registration status of said vehicle to said electronic visual display screen.

12. The electronic vehicular license plate tab of claim 11 including a Global Positioning System supported within said waterproof housing and connected to said central processing unit.

13. The electronic vehicular license plate tab of claim 11 wherein the electronic visual display screen may be updated to display said vehicle's license plate as being expired or that a vehicle has been stolen.

\* \* \* \* \*